(12) United States Patent
Iwasaki et al.

(10) Patent No.: US 9,547,035 B2
(45) Date of Patent: Jan. 17, 2017

(54) SYSTEM AND METHOD FOR CONVERGING CURRENT WITH TARGET CURRENT IN DEVICE UNDER TEST

(71) Applicant: Keysight Technologies, Inc., Minneapolis, MN (US)

(72) Inventors: Katsuhito Iwasaki, Hino (JP); Masaharu Goto, Hanno (JP); Tomonori Ura, Tokyo (JP)

(73) Assignee: Keysight Technologies, Inc., Santa Rosa, CA (US)

( * ) Notice: Subject to any disclaimer, the term of this patent is extended or adjusted under 35 U.S.C. 154(b) by 247 days.

(21) Appl. No.: 14/265,772

(22) Filed: Apr. 30, 2014

(65) Prior Publication Data

US 2015/0316607 A1    Nov. 5, 2015

(51) Int. Cl.
| | | |
|---|---|---|
| G01R 31/00 | (2006.01) | |
| G01R 31/26 | (2014.01) | |
| G01R 31/28 | (2006.01) | |
| G11C 5/00 | (2006.01) | |
| G01R 1/00 | (2006.01) | |

(52) U.S. Cl.
CPC ....... *G01R 31/2621* (2013.01); *G01R 31/2633* (2013.01); *G01R 31/2832* (2013.01); *G01R 31/2851* (2013.01); *G01R 1/00* (2013.01); *G11C 5/00* (2013.01); *H03F 2200/00* (2013.01); *H03K 2217/00* (2013.01)

(58) Field of Classification Search
CPC ......... G01R 1/00; G11C 5/00; G11C 2207/00; H03K 3/00; H03K 2217/00; H03F 1/00; H03F 2200/00

See application file for complete search history.

(56) References Cited

U.S. PATENT DOCUMENTS

| | | | |
|---|---|---|---|
| 5,754,041 A | 5/1998 | Kaito et al. | |
| 6,396,298 B1 * | 5/2002 | Young ................ | G01R 31/2621 324/762.09 |

(Continued)

FOREIGN PATENT DOCUMENTS

JP    2002-040091    2/2002

OTHER PUBLICATIONS

Hewlett Packard "HP 4142B Modular DC Source/Monitor Operation Manual", Mar. 1992, pp. 1-304.

(Continued)

*Primary Examiner* — Jermele M Hollington
*Assistant Examiner* — Temilade Rhodes-Vivour

(57) ABSTRACT

A test system measures parameters of a device under test (DUT), including a transistor. The test system includes a first voltage source unit for supplying a gate voltage; a second voltage source unit for supplying one of a drain voltage or a source voltage, the second voltage source having a current measurement device for detecting one of a drain current or a source current flowing through the transistor, respectively; a feedback unit for outputting a feedback current, based on the one of the drain or source currents; and an error amplifier for outputting a feedback control signal, based on comparison of the feedback current and a target current value. The first voltage source unit adjusts the gate voltage based on the feedback control signal so that the one of the drain or source currents converges to match the target current value.

20 Claims, 10 Drawing Sheets

(56) References Cited

U.S. PATENT DOCUMENTS

| | | | |
|---|---|---|---|
| 7,479,768 B1* | 1/2009 | Salmi | H02M 3/157 323/224 |
| 2006/0087362 A1* | 4/2006 | O'Halloran | G11C 27/02 327/427 |
| 2008/0001661 A1* | 1/2008 | Tachibana | H03F 3/347 330/253 |
| 2009/0218996 A1* | 9/2009 | Kaplish | G01R 19/0092 323/272 |
| 2010/0103005 A1* | 4/2010 | Nolan | H03F 3/195 341/120 |
| 2010/0127729 A1* | 5/2010 | Zjajo | G01R 31/318558 324/750.3 |
| 2010/0156492 A1* | 6/2010 | Perkins | G01R 31/2839 327/175 |
| 2013/0057240 A1* | 3/2013 | Zambetti | H02M 3/1584 323/271 |

OTHER PUBLICATIONS

Hewlett Packard, "DC Characterization of Semiconductor Power Devices", 1991, pp. 1-19.

Hewlett Packard, "HP 4142B Modular DC Source/Monitor; Techniques and Applications for High Throughput and Stable Characterization", 1988, pp. 1-24.

Hee-Gook Lee et al., "A Simple and Accurate Method to Measure the Threshold Voltage of an Enhancement-Mode MOSFET", IEEE Transactions on Electron Devices, vol. ED-29, No. 2, Feb. 1982, pp. 346-348.

Eric Vittoz, "CMOS Analog Integrated Circuits Based on Weak Inversion Operation", IEEE Journal of Solid-State Circuits, vol. SC-12, No. 3, Jun. 1977, pp. 224-231.

Komaragiri, "A Simulation Study on the Performance Improvement of CMOS Devices using Alternative Gate Electrode Structures" (Jan. 2006), pp. 1-118.

Agilent Technologies, "Chapter 7: Diode and Transistor Measurement", The Parametric Measurement Handbook, Third Edition, Mar. 2012, pp. 125-132.

A. Ortiz-Conde et al., "A review of recent MOSFET threshold voltage extraction methods", Microelectronics Reliability, 42 (2002), pp. 583-596.

Matthias Bucher et al., "Analysis of Transconductances at all Levels of Inversion in Deep Submicron CMOS," 9th International Conference on IEEE Electronics, Circuits and Systems, 2002, vol. 3, pp. 1183-1186.

* cited by examiner

SYSTEM AND METHOD FOR CONVERGING CURRENT WITH TARGET CURRENT IN DEVICE UNDER TEST

BACKGROUND

It is difficult under certain circumstance to measure various voltages of a device under test (DUT), particularly when the DUT includes one or more field-effect transistors (FETs). There are a number of conventional methods used for measuring the threshold voltage of a FET. For example, according to a conventional linear search method, a gate voltage of the FET is swept between lower and upper limits of a predetermined search range, while drain current or source current flowing through the FET is measured for each gate voltage. When the gate voltage causes the drain current or the source current to obtain the desired value, the measurement is finished. However, the overall measurement time of the linear search method may be rather long because the measurement of the drain current or the source current at each gate voltage requires a sufficient convergence waiting time, which must be repeated several times at close intervals in order to obtain necessary resolution.

Another example is a conventional binary search method, according to which the gate voltage of the FET is swept between lower and upper limits of a predetermined search range, again, while the drain current or the source current flowing through the FET is measured for each gate voltage. When the gate voltage causes the drain current or the source current to obtain the desired value, the measurement is finished. By determining a setting of the gate voltage based on the binary search method, the number of times that the gate voltage is set until the search is finished is generally less than using the linear search method, thus shortening measurement time. In this method, on the assumption that there are N points of measurement from the lower limit to the upper limit of the search range based on resolution, the search may be completed with log 2N times of measurement at most, and the gate voltage is therefore applied less often than in the linear search method.

However, in order to perform the binary search method measurement with high precision, the gate voltage is set and applied a sufficient number of times to obtain the desired high resolution. The operation of performing the measurement by waiting for the corresponding convergence is repeated, and hence the binary search method is disadvantageous in that the overall measurement time becomes longer. In addition, a voltage higher than a convergence value of the voltage may be applied as the gate voltage before the convergence value is finally determined. Therefore, due to influences of thermal stress on the particular DUT, the binary search method may actually be inferior to the linear search method with respect to precision, reproducibility, and stability of the measured value. For example, the measured values may fluctuate due to stress on the DUT.

Thus, generally, conventional measurement devices and corresponding methods have a number of drawbacks. For example, setting the gate voltage and measuring the current are typically performed to search for the threshold voltage, and hence the measurement requires much time. Also, feedback gain of the measurement device may be difficult to set, resulting in taking too wide of a margin, which increases convergence time. In addition, only a source current can be fed back.

SUMMARY

In a representative embodiment, a test system for measuring at least one parameter of a device under test (DUT), including a transistor, comprises first and second voltage source units, a feedback unit and an error amplifier. The first voltage source unit is configured to supply a gate voltage to a gate of the transistor, the first source unit comprising a voltage measurement device. The second voltage source unit is configured to supply one of a drain voltage or a source voltage to a drain or a source of the transistor, respectively, the second voltage source comprising a current measurement device configured to detect one of a drain current or a source current flowing through the drain or the source of the transistor, respectively. The feedback unit is configured to connect with the current measurement device and to output a feedback current during a feedback control operation, based on the one of the drain current or the source current detected by the current measurement device. The error amplifier is configured to output a feedback control signal, based on comparison of the feedback current from the feedback unit and a target current value, to the first voltage source unit. The first voltage source unit is further configured to adjust the gate voltage of the transistor so that the one of the drain current or the source current converges to match the target current value. Also, the error amplifier includes a feedback gain determined based on the target current value and a coefficient, which is determined by a relationship between the gate voltage and the one of the drain current or the source current in a sub-threshold region of the transistor.

In another representative embodiment, a test system for measuring at least one parameter of a DUT, including a diode, comprises first and second voltage source units, a feedback unit and an error amplifier. The first voltage source unit is connected to an anode of the diode and is configured to supply a bias voltage to the anode, the first source unit comprising a voltage measurement device. The second voltage source unit is connected to a cathode of the diode and includes a current measurement device configured to detect a diode current flowing through the diode. The feedback unit is configured to connect with the current measurement device and to output a feedback current during a feedback control operation based on the diode drain current. The error amplifier is configured to output a feedback control signal, based on comparison of the feedback current from the feedback unit and a target current value, to the first voltage source unit. The first voltage source unit is further configured to adjust the bias voltage of the transistor so that the diode current converges to match the target current value. The error amplifier includes a feedback gain based on the target current value and a coefficient, which is determined by a relationship between the bias voltage and the diode current.

In another representative embodiment, a method is provided for measuring at least one parameter of a DUT, including a transistor. The method comprises detecting one of a drain current or a source current flowing through one of a drain and a source of the transistor, respectively, using a current measurement unit; feeding back the detected one of the drain current or the source current via an error amplifier to a first voltage source unit for supplying a gate voltage to a gate of the transistor; and adjusting the gate voltage of the transistor based on the feedback so that the one of the drain current or the source current converges to a target current value. The error amplifier includes a feedback gain determined based on the target current value and a coefficient, which is determined by a relationship between the gate voltage and the one of the drain current or the source current in a sub-threshold region of the transistor.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings. Generally, it is understood that the drawings and the various elements depicted therein are not drawn to scale.

Generally, various embodiments relate to measurement of threshold voltage ($V_{TH}$) of a transistor, such as a metal-oxide-semiconductor field-effect transistor (MOSFET), or measurement of bias voltage ($V_{bias}$) of a diode, such as a Shockley diode. For example, embodiments are directed to a constant current method for high-speed measurement of threshold voltage $V_{TH}$ of a transistor gate, defined as the gate voltage of the transistor applied when the drain current or source current having a predetermined value (target current value) is caused to flow through the transistor. Other embodiments are directed to methods for high-speed measurement of bias voltage applied when a current having a predetermined value is caused to flow through a diode.

For example, the various embodiments cause the transistor to quickly converge to a state in which the drain current (or the source current, depending on transistor configuration) has the target current value, enabling the gate voltage in the converged state to be measured with high speed and precision. Also, the various embodiments similarly cause a diode to quickly converge to a state in which a diode current has the target current value, enabling measurement of a bias voltage in the converged state with high speed and precision.

By applying various embodiments, it is possible to provide high-speed convergence using the constant current method for a MOS device, for example. A method and a device for measuring a voltage in the above-mentioned state with high speed and precision (to cause a MOS device to converge to a state in which a current has the target current value, and a method and a device for measuring various parameters in the above-mentioned state are also provided.

Figure 1:
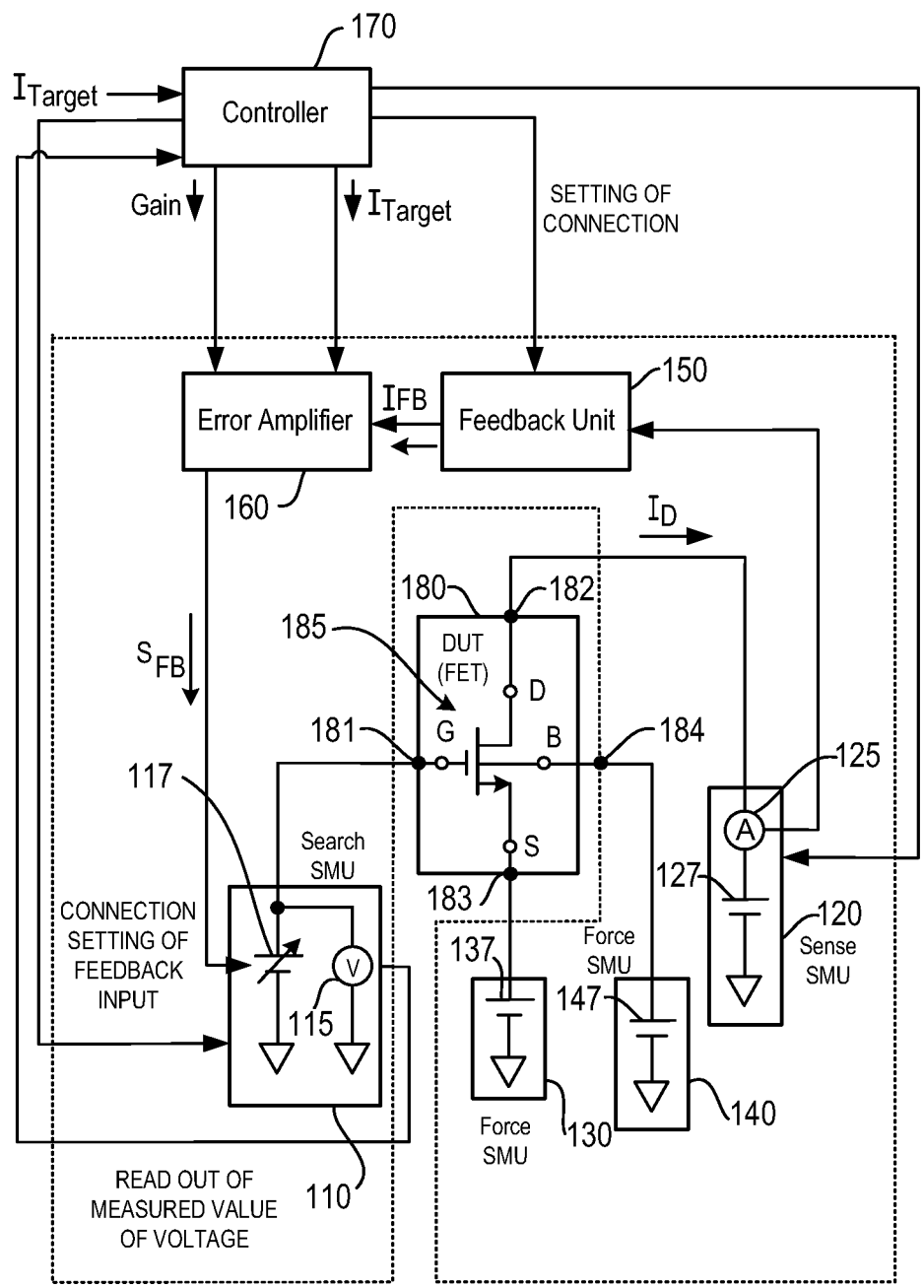
FIG. 1 is a block diagram illustrating a test system for measuring a threshold voltage of a device under test (DUT), according to a representative embodiment.

FIG. 1 is a block diagram illustrating a control system for controlling a threshold voltage of a device under test (DUT), according to a representative embodiment.

Referring to FIG. 1, test system 100 is configured to control the threshold voltage ($V^{TH}$) of DUT 180, which in the depicted embodiment includes transistor 185, which may be a MOSFET, for example. However, other types of transistors may be included in the DUT 180, including a bipolar junction transistor (BJT), for example, without departing form the scope of the present teachings. The DUT 180 has gate, drain and source terminals 181, 182 and 183 corresponding to a gate, a source and a drain of the transistor 185, respectively.

The test system 100 includes multiple voltage sources for supplying power to the transistor 185. One or more of the voltage sources may be implemented as source measurement units (SMUs), which source power to the transistor 185, as well as monitor voltage and current consumed by the transistor 185 for purposes of testing and measurement. For example, in the depicted embodiment, the test system 100 includes first voltage source unit 110 configured to apply a gate voltage VG to the gate of the transistor 185 via the DUT gate terminal 181, second voltage source unit 120 configured to apply a drain voltage VD to the drain of the transistor 185 via the DUT drain terminal 182, third voltage source unit 130 configured to apply a source voltage VS to the source of the transistor 185 via the DUT source terminal 183, and a fourth voltage source unit 140 configured to apply a source-body voltage VSB to the body of the transistor 185 via a DUT body terminal 184. Each of the gate voltage VG, the drain voltage VD, the source voltage VS and the source-body voltage VSB is typically a ground voltage, although other voltages may be used without departing from the scope of the present teachings.

As shown in FIG. 1, the first voltage source unit 110 may be a search SMU, for example, including a voltage measurement device 115 and a variable voltage source 117 connected in parallel with the voltage measurement device 115 between the gate terminal 181 and ground voltage. The voltage measurement device 115 of the first voltage source unit 110 measures the gate voltage $V_G$. The second voltage source unit 120 may be a sense SMU, for example, including a current measurement device 125 and a voltage source 127 connected in series with the current measurement device 125 between the drain terminal 182 and ground voltage. The sense SMU typically forces 0V, for example. The current measurement device 125 of the sense SMU continuously monitors the drain current $I_D$ flowing through the drain of the transistor 185. The third voltage source unit 130 may be a first force SMU, including a voltage source 137 connected to the source terminal 183 to provide source voltage $V_S$. The fourth voltage source unit 140 may be a second force SMU, including a voltage source 147 connected to the body terminal 184 to provide a source-body voltage $V_{SB}$, where the source-body voltage $V_{SB}$ applied to the body of the transistor 185 may be set as desired, e.g., by a user or by another control device.

The test system 100 further includes a feedback unit 150, an error amplifier 160, and a controller 170. The drain current $I_D$ monitored by the second voltage source unit 120 is sent to the feedback unit 150, which may function as a multiplexer or a matrix, for example. In response, the feedback unit 150 makes appropriate connections between the sense SMU (e.g., the second voltage source unit 120, in this case) and the error amplifier 160, and outputs a feedback current $I_{FB}$ to the error amplifier 160 corresponding to the drain current $I_D$. In an alternative configuration, the feedback unit 150 may be implemented simply as a wire or other conductor (e.g., conductive cable). In this case, the drain current $I_D$ is provided to directly the error amplifier 160 as the feedback current $I_{FB}$. If the user wants to feedback current from the source terminal 183 (as opposed to the drain terminal 182), the feedback data is based on the source current $I_S$ from source SMU, as discussed below with reference to FIG. 8. Generally, the feedback unit 150 switches the current source from one or more sense SMUs (measuring drain current or source current).

The error amplifier 160 is configured to receive the feedback current $I_{FB}$ from the feedback unit 150 and to determine a feedback control signal $S_{FB}$ based on a comparison between the feedback current $I_{FB}$ and a target current value $I_{target}$. In the depicted embodiment, the target current value $I_{target}$ corresponds to the drain current $I_D$ in a sub-threshold region of the transistor 185.

More particularly, the controller 170 receives the target current value $I_{target}$, which may be input by the user, for example, at the beginning of the measurement process. The controller 170 calculates the gain of the error amplifier 160, which may be referred to as "feedback gain," based on the target current value $I_{target}$ and a coefficient. The coefficient may be referred to as the "constant of proportionality," and is determined by a relationship between the gate voltage $V_G$ and the drain current $I_D$ in the sub-threshold region of the transistor 185, as discussed below. The controller 170 sets both the calculated feedback gain and the target current value $I_{target}$ in the error amplifier 160 as part of the feedback loop. Calculation of the feedback gain, generally, is discussed below with reference to Equation (2).

The first voltage source unit 110 receives the feedback control signal $S_{FB}$ from the error amplifier 160. The feedback control signal SFB is applied to the variable voltage source 117 to adjust the gate voltage $V_G$ in response feedback. The adjusted gate voltage $V_G$ is applied to the gate terminal of the transistor 185, so that the value of the drain current $I_D$ converges toward the target current value $I_{target}$.

Notably, the controller 170 controls overall operations of the test system 100, including the first through fourth voltage source units 110-140, the error amplifier 160 and the feedback unit 150 by control lines, indicated in FIG. 1. This allows the controller 170 to write various settings, in addition to the above-mentioned settings, to each of the first and second voltage source units 110 and 120, the error amplifier 160 and the feedback unit 150, to start and stop the corresponding measurement operations, and to read out specific data, such as measured values from the first voltage source unit 110 (search SMU) after the measurement is finished. When the feedback unit 150 is implemented as a wire or other conductor, there may be no need for the controller 170 to set the connection or otherwise control the feedback unit 150. Furthermore, the controller 170 is able to set output voltages and output currents for each of the first through fourth voltage source units 110-140, and to read corresponding measured voltage and current values, respectively. Also, in an embodiment, the controller 170 is configured to monitor total feedback gain of the test system 100, and to adjust the feedback gain of the error amplifier 160 dynamically when the total feedback gain exceeds a predetermined range, as discussed below with reference to Equation (7), for example. Generally, when a gain margin is less than ¼, the feedback loop is stable. But, when a gain margin is too small (for example, less than about 1/40), convergence time increases substantially.

In various embodiments, the controller 170 may be implemented by one or more computer processors, application specific integrated circuits (ASICs), field-programmable gate arrays (FPGAs), or combinations thereof, using software, firmware, hard-wired logic circuits, or combinations thereof, as discussed further below. For example, the controller 170 may be a mobile device, such as a personal computer (PC) or a tablet installed with a Windows® operating system (OS) manufactured by Microsoft Corporation, a PC, workstation or mobile device installed with another OS, such as Linux or Android, or an electronic device mounted with a controller formed of a general-purpose central processing unit (CPU) or a dedicated/general-purpose integrated circuit (IC), such as ASIC or FPGA, which includes a storage device (such as RAM, a ROM, flash memory, EPROM, EEPROM, HDD, or a storage medium drive for a CD/DVD/Blu-ray disc).

As mentioned above, each of the first through fourth voltage source units 110-140 may function as an SMU having the capability of applying voltage and/or current, while monitoring and/or measuring the same. An example of an SMU is described in U.S. Pat. No. 5,754,041 (May 19, 1998) to Kaito et al., which is hereby incorporated by reference. In addition, each of the first through fourth voltage source units 110-140 may function may be implemented using analog control or digital control, without departing from the scope of the present teachings.

The feedback unit 150 likewise may be configured to perform analog or digital feedback, in accordance with a control format or interface of the SMUs. Examples of analog feedback units include an Agilent 41425A available from Agilent Technologies, Inc., or merely a conductive wire, as mentioned above. Also, the error amplifier 160 may be configured as an analog or digital error amplifier, in accordance with the properties and interface of the feedback unit 150. Generally, an analog error amplifier has an analog gain adjustment circuit and a digital error amplifier (e.g., an adder) digitally calculates and outputs a gain.

Figure 2:
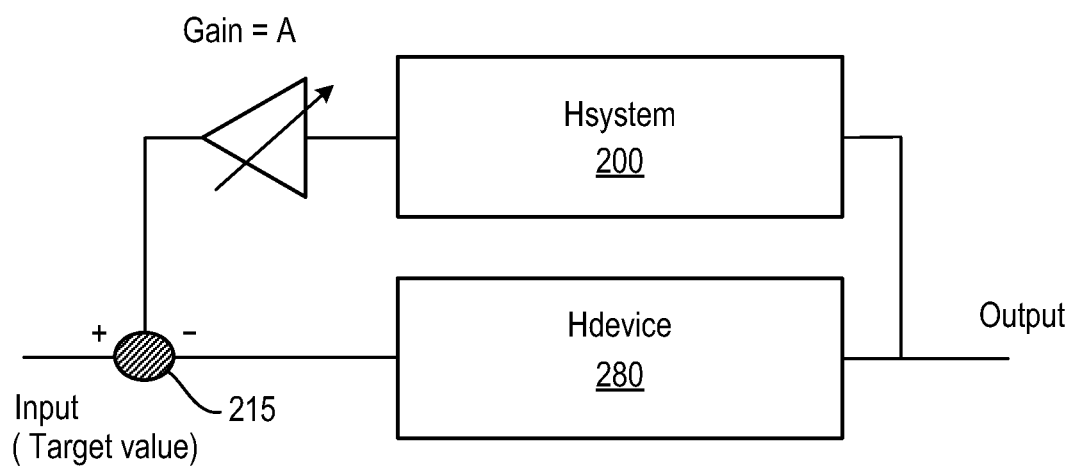
FIG. 2 is a logic diagram of the test system and DUT, according to a representative embodiment.

FIG. 2 is a logic diagram of the test system 100 and the DUT 180, according to a representative embodiment. How the controller 170 calculates and sets the feedback gain for the error amplifier 160 is described below with reference to FIG. 2.

Referring to FIG. 2, the transmission characteristic of the test system 100 ($H_{system}$) is indicted by block 200, and the transmission characteristic of the DUT 180 ($H_{device}$) is indicated by block 280. The feedback gain calculated by the controller 170 and set in the error amplifier 160 is indicated by variable gain element A, which effectively determines the response speed of the test system 100. Block 280 receives a voltage (e.g., gate voltage $V_G$) as input, and provides a current (e.g., drain current $I_D$) as output In operation, the gate voltage $V_G$ initially applied by the first voltage source unit 110 is input to block 280 (DUT 180), having the device transmission characteristic $H_{device}$, which is to be controlled. The drain current $I_D$ output of block 280 is fed back to block 200 (e.g., feedback unit 150 and error amplifier 160), having the system transmission characteristic $H_{system}$, which adjusts the variable gain A (feedback gain). The drain current $I_D$ thus acts as a control amount against an input amount of the gate voltage $V_G$. The feedback control signal $S_{FB}$, resulting in part from variable gain A, adjusts the input gate voltage $V_G$ as indicated by adder 215.

When the DUT 180 is a semiconductor device (as in the depicted example), it typically exhibits a relationship indicated by Expression (1):

$$I \propto \exp(aV) \quad (1)$$

In Expression (1), "I" represents current value (e.g., drain current $I_D$), "V" represents voltage value (e.g., gate voltage $V_G$), and "a" represents a constant of proportionality. Accordingly, the constant of proportionality a may be determined based on the expressed relationship between the current value I and the voltage value V.

Transmission gain (gm) (or "transconductance") of the current output by the semiconductor device with respect to a voltage setting may expressed by Equation (2):

$$gm = dI/dv = aI \quad (2)$$

Thus, in the depicted embodiment, the transmission characteristic $H_{device}$ of the DUT 180 at an operation point corresponding to the target current value (i.e., $I = I_{target}$) can be obtained by the product of the constant of proportionality a and the target current value $I_{target}$ (i.e., $a \times I_{target}$), in accordance with Equation (2). This allows an appropriate value to be set by the controller 170 as the feedback gain A within the feedback loop. It is therefore possible to realize an increase of in measurement speed of the test system 100, while ensuring stability, and to achieve convergence of the measurement operation with only one feedback loop with respect to the set value of the feedback gain in the embodiment illustrated in FIG. 3.

In addition, the drain current $I_D$ of the transistor 185 can be expressed by Equation (3) in a sub-threshold region in which the transistor 185 is not turned on:

$$I_D = SI_{D0} e^{\frac{V_G}{nV_T}} \left( e^{-\left(\frac{V_S}{V_T}\right)} - e^{-\left(\frac{V_D}{V_T}\right)} \right) \quad (3)$$

In Equation (3), "S" represents a geometrical shape factor of the transistor 185 (e.g., effective width over effective length of the channel), "$V_T$" is indicated by kT/q, "$V_S$" represents source voltage (e.g., source-substrate), "$V_D$" represents drain voltage (e.g., drain-substrate), "$V_G$" represents gate voltage (e.g., source-substrate), "$I_D$" represents drain current, "$I_{D0}$" represents characteristic current, and "n" represents a slope factor. Equation (3) is substantially derived from Vittoz et al., "CMOS Analog Integrated Circuits Based on Weak Inversion Operation," IEEE JOURNAL OF SOLID-STATE CIRCUITS, Vol. SC-12, No. 3, pp. 224-231 (June 1977), which is hereby incorporated by reference (e.g., where when $U_T$ in Expression (7) of Vittoz et al. is replaced by $V_T$).

Assuming that a surface state of the transistor 185 has a concentration that can be ignored, the slope factor n may be provided by Equation (4), also obtained from Vittoz et al., as follows:

$$n = 1 + Cd/Cox \quad (4)$$

In Equation (4), "Cd" represents surface depletion capacitance, and "Cox" represents oxide capacitance per unit area. Notably, the surface depletion capacitance Cd may be expressed by Equation (5), as follows:

$$C_d = \frac{C_{ox}}{1 + \frac{\varepsilon_{ox} X_d}{\varepsilon_{si} t_{ox}}} \quad (5)$$

Equation (5) is obtained from Komaragiri, "A Simulation Study on the Performance Improvement of CMOS Devices using Alternative Gate Electrode Structures" (January 2006), pp. 1-96, which is hereby incorporated by reference (applying Equation 2.21). Accordingly, the surface depletion capacitance Cd is necessarily less than the oxide capacitance per unit area Cox (Cd<Cox). It therefore follows that the slope factor n is necessarily greater than one (n>1). For example, at T=300 K, n≈1.5.

Thus, referring to Equations (2) through (5), the transmission gain gm of the transistor 185 may be obtained by Equation (6), as follows:

$$gm = \frac{\delta I_d}{\delta V_{gs}} = SI_{D0} e^{\frac{V_G}{nV_T}} \left( e^{-\left(\frac{V_S}{V_T}\right)} - e^{-\left(\frac{V_D}{V_T}\right)} \right) \frac{1}{nV_T} \quad (6)$$

$$gm = \frac{1}{nV_T} I_d = qI_d / (nKT)$$

Accordingly, when a charge q of an electron, the Boltzmann constant k, an absolute temperature T, and a desired drain current $I_d$ are substituted into Equation (6), an approximate transmission gain gm of the transistor 185 can be calculated. Based on the transmission gain gm, it is possible to determine the transmission characteristic $H_{device}$ of the transistor 185. Accordingly, it is also possible to calculate an appropriate gain (i.e., the feedback gain) to be set for the error amplifier 160 illustrated in FIG. 3. This eliminates the need to use the feedback gain with extremely low speed in order to avoid oscillation, as in conventional measurement systems, and also allows an appropriate feedback gain to be set in the error amplifier 160 by the controller 170, such that threshold voltage $V_{TH}$ is measured very quickly.

For example, at a room temperature T=300 (K), the transmission gain gm may be calculated by entering q=1.602e−19 (C) and k=1.381e−23 [$m_2$ kg $s^{-2}$ $K^{-1}$] into Equation (6), along with "n" and the desired drain current "$I_d$" (i.e., the target current value $I_{target}$). As discussed above, the transmission gain gm is set as the feedback gain for the error amplifier 160 illustrated in FIG. 3. As the maximum value (i.e., the worst value) of the feedback gain to be transmission gain gm, n=1 may be used, resulting in the transmission gain gm being less than the product of 40 and the drain current $I_d$ (gm<40$I_d$). Also, the maximum value may be used for the gain setting for the error amplifier 160 illustrated in FIG. 3.

Furthermore, the product of the transmission gain gm and $V_T/I_d$ represents the maximum value in the weak inversion region of the transistor 185, as described, for example, by Bucher et al., "Analysis of Transconductances at all Levels of Inversion in Deep Submicron CMOS," 9TH INTERNATIONAL CONFERENCE ON IEEE ELECTRONICS, CIRCUITS AND SYSTEMS, 2002, Vol. 3, pages 1183-1186 (2002), which is hereby incorporated by reference. It therefore follows that a method of determining the feedback gain of the error amplifier 160 based on the maximum value of the transmission gain gm may be applied to the strong inversion region of the transistor 185, as well as to the sub-threshold region of the transistor 185. Accordingly, oscillation may be prevented even when the strong inversion region is in a state in which the transistor 185 satisfies the target current value $I_{target}$, e.g., due to a device defect of the DUT 180 or the like.

Notably, a differential transmission gain gm of a drain current $I_D$ with respect to the gate voltage $V_G$ within the sub-threshold region of the transistor 185 exponentially varies with respect to variations of the gate voltage $V_G$, and hence, up to now, a possible gain low enough to avoid oscillation is set. However, the transmission gain gm and the drain current $I_D$ are in a linear relationship in the weak inversion region of the transistor 185 for which measurement of the threshold voltage $V_{TH}$ is performed. Therefore, when the user sets the target current value $I_{target}$ based on the above-mentioned relational expression provided by Equation (6), it is possible to limit the maximum value of the transmission gain gm at a threshold value operation point to be the target. Accordingly, it is possible to set the feedback gain without oscillation using only the target current value $I_{target}$ set by the user.

As a result, it is possible to cause the transistor 185 to converge to such a value of the gate voltage $V_G$ as to exhibit a target drain/source current value with convergence speed within a range expected in advance, without oscillation. Furthermore, as described above, even when the strong inversion region of the transistor 185 is affected in the state in which the transistor 185 satisfies the target current value $I_{target}$ due to a defect of the DUT 180 or the like, the value of gm/Id is below the weak inversion region, and hence oscillation is prevented.

Considering a particular temperature T, two possible methods exist for expediting convergence to enable the measurement process. A first method enables the user to input the temperature T as a parameter of the measurement. A second method assumes a temperature range and uses the lowest temperature from the assumed temperature range to calculate the maximum value of the transmission gain gm. That is, from Equation (6), when the temperature T is the smallest in the assumed temperature range, the transmission gain gm will be at its largest value.

Figure 3:
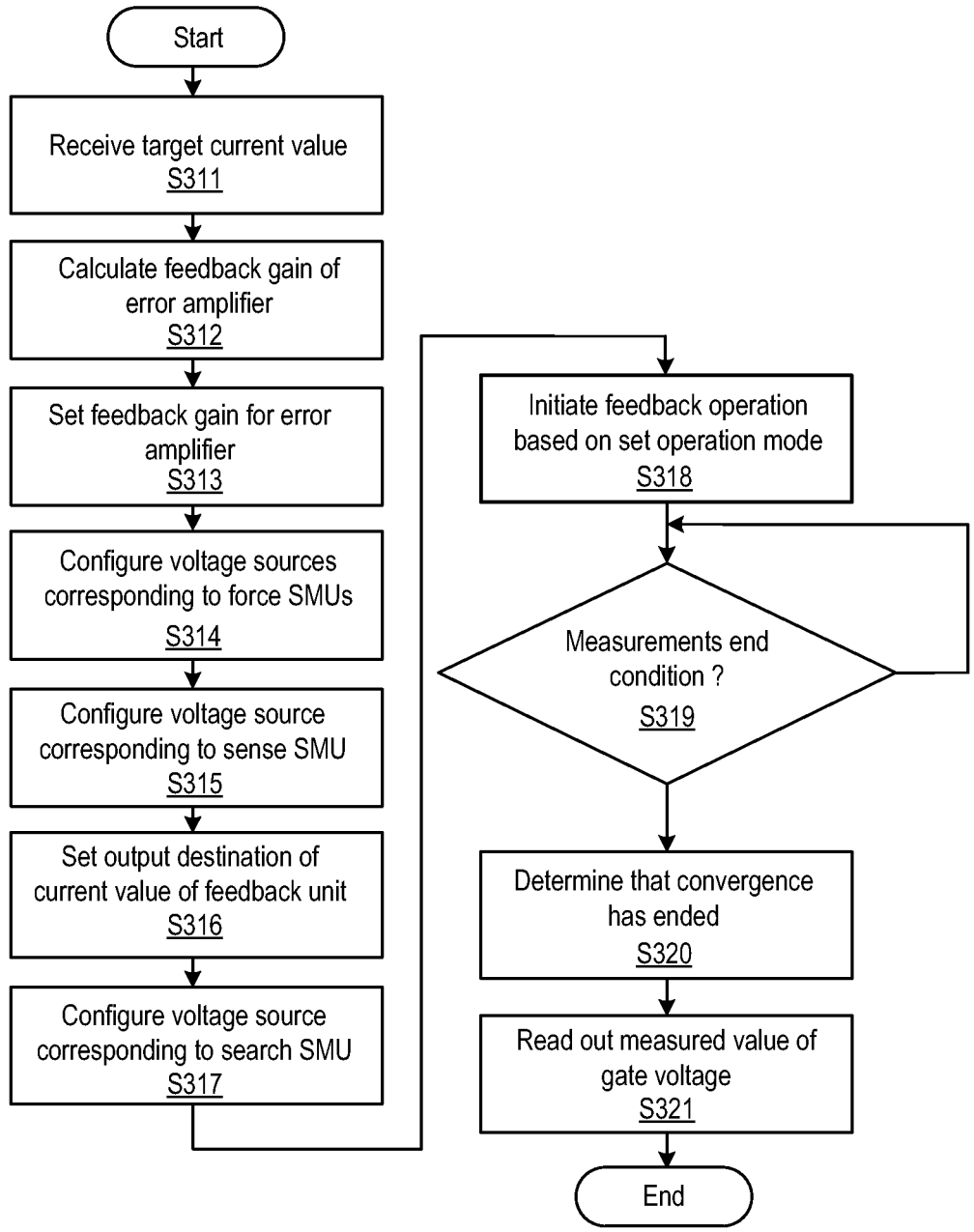
FIG. 3 is a flow diagram illustrating a method of measuring a threshold voltage of a DUT, according to a representative embodiment.

FIG. 3 is a flow diagram illustrating a method of controlling a threshold voltage of a DUT, according to a representative embodiment. The various operations depicted in FIG. 3 may be executed by the controller 170 shown in FIG. 1, for example.

Referring to FIGS. 1 and 3, the controller 170 receives setting information, such as the target current value $I_{target}$, in block S311. The target current value $I_{target}$ may be provided by a user or another control device, for example, through an appropriate I/O interface, as would be apparent to one of ordinary skill in the art. The feedback gain of the error amplifier 160 is calculated based on the target current value $I_{target}$ in block S312, and the calculated feedback gain is set in the error amplifier 160 in block S313.

The controller 170 then configures the voltage sources corresponding to force SMUs for performing the measurement operation block S314. This configuration includes setting the value of the source voltage $V_S$ for the third voltage source unit 130 (first force SMU) to be applied to the DUT source terminal 183, and setting the value of the source-body voltage $V_{SB}$ for the fourth voltage source unit 140 (second force SMU) to be applied to the DUT body terminal 184 of the DUT 180.

In block S315, the controller 170 configures the second voltage source unit 120 (sense SMU) for the measurement operation. This configuration includes setting the value of the voltage for the second voltage source unit 120, which is applied to the drain terminal 182 of the DUT 180, setting the second voltage source unit 120 to a current measurement mode (of drain current $I_D$), and setting a feedback destination of the drain current value measured by the current measurement device 125 to the feedback unit 150. Likewise, the controller 170 sets an output destination of the current value of the feedback unit 150 so as to be connected to the first voltage source unit 110 via the error amplifier 160 in step S316. The drain voltage $V_D$, the source voltage $V_S$ and the source-body voltage $V_{SB}$ must be constant during measurement of the threshold voltage $V_{TH}$.

In block S317, the controller 170 configures the first voltage source unit 110 (search SMU) for the measurement operation. This configuration includes setting the start value of the gate voltage $V_G$ for the first voltage source unit 110, setting the first voltage source unit 110 to a voltage measurement mode (of gate voltage $V_G$), and setting an operation mode of the first voltage source unit 110 to an operation based on feedback (feedback current $I_{FB}$) provided by the feedback unit 150. Notably, when the DUT 180 is subjected to repeated measurements of a threshold voltage $V_{TH}$ in a similar manner, e.g., as in the case of an array test structure, the step of setting the start value of the applied gate voltage $V_G$ for the first voltage source unit 110 may be omitted, and the present voltage value may be used as a start voltage in order to shorten measurement time.

The feedback operation from the first voltage source unit 110 (sense SMU) to the second voltage source unit 120 (search SMU) is initiated in block S318 based on the setting of the operation mode in block S317 to perform measurement of the gate voltage $V_G$. In block S319, the controller 170 determines whether the measurement end condition has been satisfied by performance of the feedback operation. When the measurement end condition has not been satisfied (block S319: No), performance of the feedback operation continues, resulting in a lapse of time (waiting time) for the measurement. When the measurement end condition is satisfied (block S319: Yes), the controller 170 determines that the convergence of the drain current $I_D$ and the target current value $I_{target}$ has occurred in block S320, and reads out the measured value of the gate voltage $V_G$ from the voltage measurement device 115 of the first voltage source unit 110 in block S321. The measured value indicates the gate voltage $V_G$ corresponding to the target current value $I_{target}$ of the drain current $I_D$. The measured value gate voltage $V_G$ is determined to be the threshold voltage $V_{TH}$.

In an embodiment, the measurement end condition may be determined based on an expected minimum value of the transmission gain gm for completing the measurement of the gate voltage $V_G$. More particularly, as an operation expected in the weak inversion region or a moderate inversion region of the transistor 185, it is determined that the feedback has provided sufficient convergence after the lapse of a waiting time for the measurement. The waiting time may be a time obtained by multiplying a time constant for the system transmission characteristic $H_{system}$, which is obtained by calculating a time from the start of the feedback operation to the start of the measurement based on the expected minimum value of gm×Vt/Id, by a predetermined number. The predetermined number is based on a time constant ($\tau$) of the test system 100. Once the time constant of the test system 100 is known, the wait time to convergence may be calculated. For example, if the wait time used is 1×$\tau$ (time constant), the drain current $I_D$ (or the source current $I_S$, discussed below) converges to only 63 percent of the target current value $I_{target}$. However, if the wait time used is 5×τ, the drain current $I_D$ (or the source current $I_S$) converges to 99.9 percent of the target current value $I_{target}$.

Then, the gate voltage $V_G$ of the first voltage source unit 110 obtained by the determination is measured as the threshold voltage $V_{TH}$, to thereby bring the measurement to an end. The measurement end condition for determining completion of the measurement may be implemented by configuring the controller 170 to start the feedback operation from the second voltage source unit 120 to the first voltage source unit 110, and measure the gate voltage $V_G$ of the first voltage source unit 110 after the lapse of a predetermined waiting time. The predetermined waiting time providing the measurement end condition may be based on a timer, for example.

The measurement end condition may incorporate other criteria without departing from the scope of the present invention. For example, FIG. 4 is a graph showing determination of convergence with respect to sensed current entering a predetermined range over a predetermined period of time, according to a representative embodiment.

Figure 4:
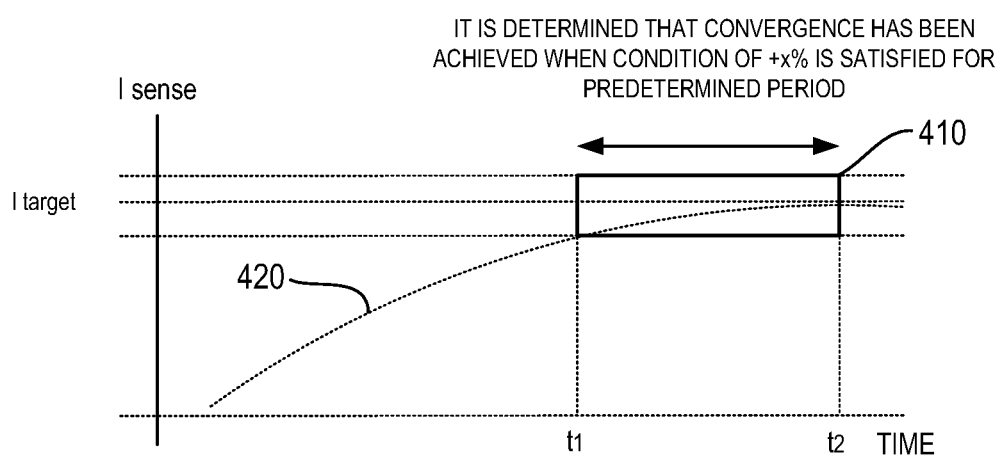
FIG. 4 is a graph showing convergence with respect to a predetermined range over time, according to a representative embodiment.

Referring to FIG. 4, the horizontal axis represents time, and the vertical axis represents the sensed current (e.g., feedback current $I_{FB}$) output by the feedback unit 150. A range 410 is determined based on ±x percent of the target current value $I_{target}$. In the depicted example, the range 410 begins at time t1, which corresponds to the feedback current $I_{FB}$ (indicated by curve 420) reaching the target current value $I_{target}$ minus a predetermined percentage (x) of the target current value $I_{target}$. The range 410 ends at time t2, which corresponds to the drain current $I_D$ matching the target current value $I_{target}$. Once the feedback current $I_{FB}$ input to the error amplifier 160 falls within the range 410 at time t1, and remains in the range 410 until time t2, it is possible to automatically determine that convergence has been achieved and to read out the gate voltage $V_G$ obtained at that time, thereby bringing the measurement to an end. Of course, other criteria for establishing the range 410 and/or for determining when the measurement end condition has been satisfied, may be incorporated without departing from the scope of the present teachings.

Following the read out of the measured gate voltage $V_G$, the controller 170 resets the test system 100 to prepare for determination of the gate voltage $V_G$ for the next DUT. That is, the controller 170 sets the connection setting of the first voltage source unit 110 back to an original operation mode, e.g., a normal operation mode inside the stand-alone first voltage source unit 110. The controller 170 also disconnects the connection setting for the feedback unit 150, and disconnects the connection setting of current value feedback for the second voltage source unit 120. Each of the first and second voltage sources 110 and 120 and the feedback unit 150 are thereby returned to their respective initial states.

Figure 5:
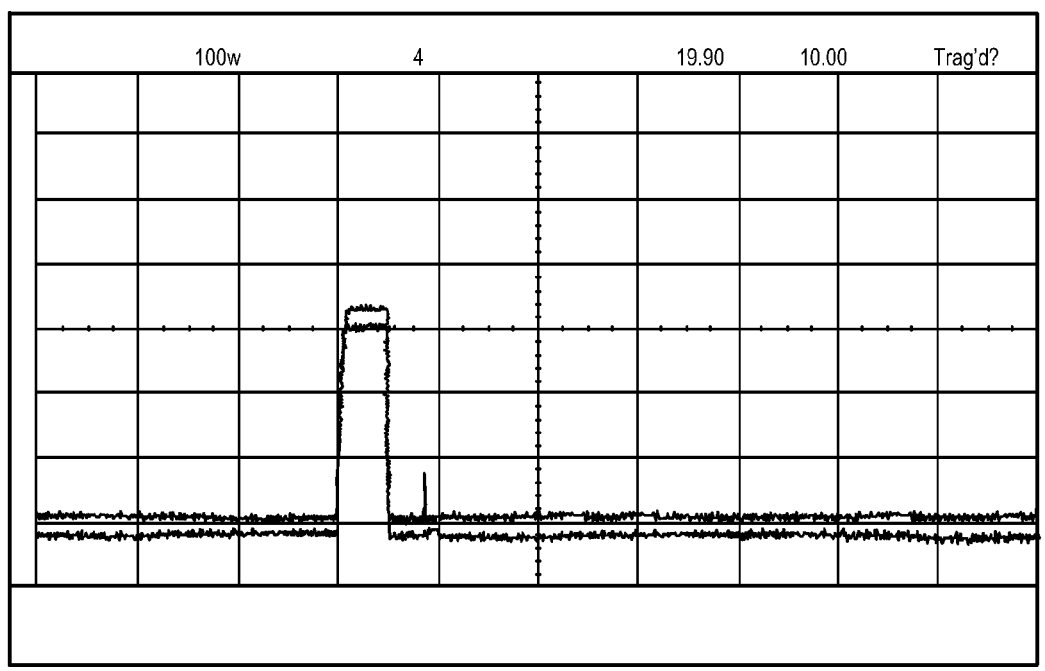
FIG. 5 is a graph showing transition of gate voltage relative to time, using the measurement method illustrated in FIG. 3.
Figure 6:
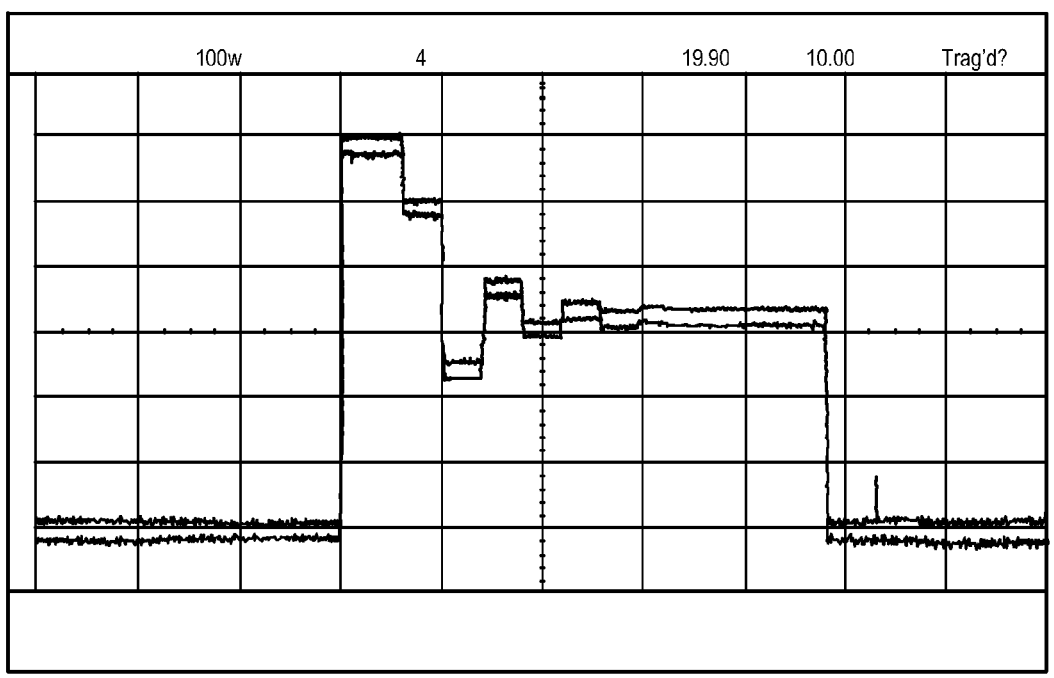
FIG. 6 is a graph showing transition of gate voltage relative to time, using a conventional binary search method, for purposes of comparison.

FIG. 5 is a graph showing transition of gate voltage relative to time, using the measurement method illustrated in FIG. 3. FIG. 6 is a similar graph showing transition of gate voltage relative to time, using a conventional binary search, for purposes of comparison. In both FIGS. 5 and 6, the horizontal axis represents time (10 ms/div), and the vertical axis represents the gate voltage $V_G$ (100 mV/div) output by a search SMU (e.g., the first voltage unit 110, according to the representative embodiment).

As shown in FIG. 5, convergence is achieved by performing the feedback loop one time according to the method of FIG. 3. Therefore, the measurement is finished significantly faster the conventional measurement method shown in FIG. 6.

Figure 7:
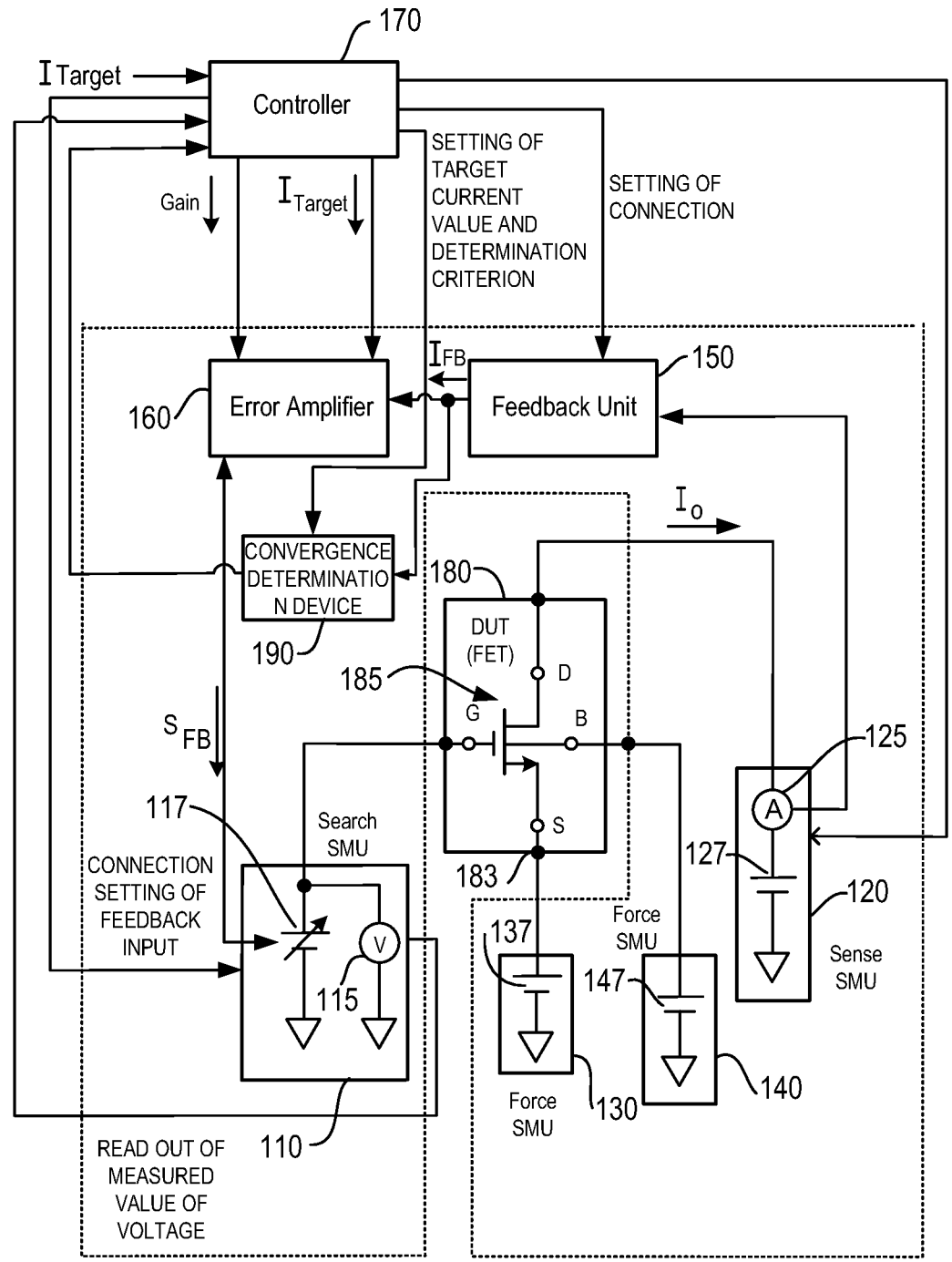
FIG. 7 is a block diagram illustrating a test system for measuring a threshold voltage of a DUT, according to a representative embodiment.

FIG. 7 is a block diagram illustrating a control system for controlling a threshold voltage of a DUT, according to another representative embodiment. Generally, FIG. 7 differs from FIG. 1 by the inclusion of a convergence determination device (e.g., convergence determination device 190), discussed below.

Referring to FIG. 7, test system 700 is configured to control the threshold voltage $V_{TH}$ of the DUT 180, which again in the depicted embodiment includes transistor 185, which may be a MOSFET, for example. Like the test system 100, the test system 700 includes multiple voltage sources for supplying power to the transistor 185, which may be implemented as SMUs. For example, in the depicted embodiment, the test system 700 includes first voltage source unit 110 configured to apply a gate voltage $V_G$ to the gate of the transistor 185 via the DUT gate terminal 181, second voltage source unit 120 configured to apply a drain voltage $V_D$ to the drain of the transistor 185 via the DUT drain terminal 182, third voltage source unit 130 configured to apply a source voltage $V_S$ to the source of the transistor 185 via the DUT source terminal 183, and fourth voltage source unit 140 configured to apply a source-body voltage VSB to the body of the transistor 185 via a DUT body terminal 184. The configurations and connections of the first through fourth voltage sources 110 to 140 are substantially the same as discussed above with reference to FIG. 1, and therefore will not be repeated.

The test system 700 further includes feedback unit 150, error amplifier 160, controller 170 and convergence determination device 190. The drain current $I_D$ monitored by the second voltage source unit 120 is detected by the feedback unit 150, which provides a feedback current $I_{FB}$ to the error amplifier 160 and the convergence determination device 190 based on the drain current $I_D$. The error amplifier 160 is configured to receive the feedback current $I_{FB}$ from the feedback unit 150 and to determine a feedback control signal $S_{FB}$ based on a comparison between the feedback current $I_{FB}$ and the a target current value $I_{target}$ received from the controller 170, as discussed above with reference to FIG. 1. As mentioned above, in alternative configurations, the feedback unit 150 may be implemented simply as a wire or other conductor.

The convergence determination device 190 also receives the target current value $I_{target}$, as well as determination criterion, from the controller 170. For example, the determination criterion may be a range of current values based on the target current value $I_{target}$ (e.g., ±x percentage of the target current value $I_{target}$). The convergence determination device 190 then monitors the output from the feedback unit 150 to determine whether the value of the feedback current $I_{FB}$ meets the determination criterion. For example, the convergence determination device 190 may determine when the feedback current $I_{FB}$ falls within the current value range of the determination criterion mentioned above. When the feedback current $I_{FB}$ is within the current value range, the convergence determination device 190 sends a convergence end trigger signal $S_{trigger}$ indicating the convergence to the controller 170, which then determines that the convergence is finished. Thus, use of the convergence determination device 190 enables the waiting time for convergence to occur to be smaller than the predetermined waiting time, discussed above. The convergence determination device 190 may include a memory (not shown) for storing the target current value $I_{target}$ and the determination criterion, and a comparator (not shown) for performing comparison operations to determine when the output from the feedback unit 150 meets the determination criterion. The functionalities of the feedback unit 150, error amplifier 160 and the controller 170 are substantially the same as discussed above with reference to FIG. 1, and therefore will not be repeated.

In another representative embodiment, the convergence determination device 190 factors in the amount of time that the feedback current value $I_{FB}$ has met the determination criterion. For example, when the convergence determination device 190 determines that the feedback current value $I_{FB}$ has been within the current value range of ±x percentage of the target current value $I_{target}$ for a predetermined time period, it may be determined that convergence has been achieved. In this case, the above-mentioned convergence determination may be implemented by configuring the convergence determination device 190 to activate a timer when the comparator of the convergence determination device 190 first detects when the feedback current $I_{FB}$ being monitored enters the current value range. When the feedback current $I_{FB}$ has been maintained in the range until the lapse of the predetermined time period, the convergence determination device 190 sends the convergence end trigger signal $S_{trigger}$ to the controller 170.

In yet another representative embodiment, the convergence determination device 190 may be used to monitor total feedback gain of the test system 700, e.g., by monitoring stability or gain margin of the feedback loop. The value of the transmission gain gm may be estimated as discussed above. However, when measuring a defective DUT or a DUT having different physical characteristics, for example, the corresponding transmission gain gm may deviate. The convergence determination device 190 may detect the transmission gain gm by making measurements of the gate voltage and the drain current (or source current) at two different time points using Equation (7), where $V_G(t1)$ is an applied gate voltage at time t1 and $I_D(t1)$ is measured drain current at time t1, $V_G(t2)$ is an applied gate voltage at time t2 (where time t2 is a time point occurring shortly after t1), and $I_D(t2)$ is measured drain current at time t2.

$$gm = \frac{I_D(t1) - I_D(t2)}{V_G(t1) - V_G(t2)} \quad (7)$$

The gate voltage $V_G$ is modified in response to the feedback control signal $S_{FB}$ from the error amplifier 160 between times t1 and t2. The value of the transmission gain gm is sent to the controller 170, which adjusts the total system gain of the system in response to the transmission gain gm. If the product of the transmission gain gm, the system transmission characteristic $H_{system}$, and the feedback gain A (gm×$H_{system}$×A) is significantly smaller than stability criteria, for example less than about 1/40, the controller 170 may increase the feedback gain A to about A×1.5, for example. On the other hand, if the product of the transmission gain gm, the system transmission characteristic $H_{system}$, and the feedback gain A (gm×$H_{system}$×A) is close to or exceeds the stability criteria, for example, greater than about 1/4, the controller 170 may decrease the feedback gain A to about A/1.5, for example. This process may be activated only when the test system 700 has not yet reached convergence, meaning that $V_G(t1)-V_G(t2)$ is not zero.

Figure 8:
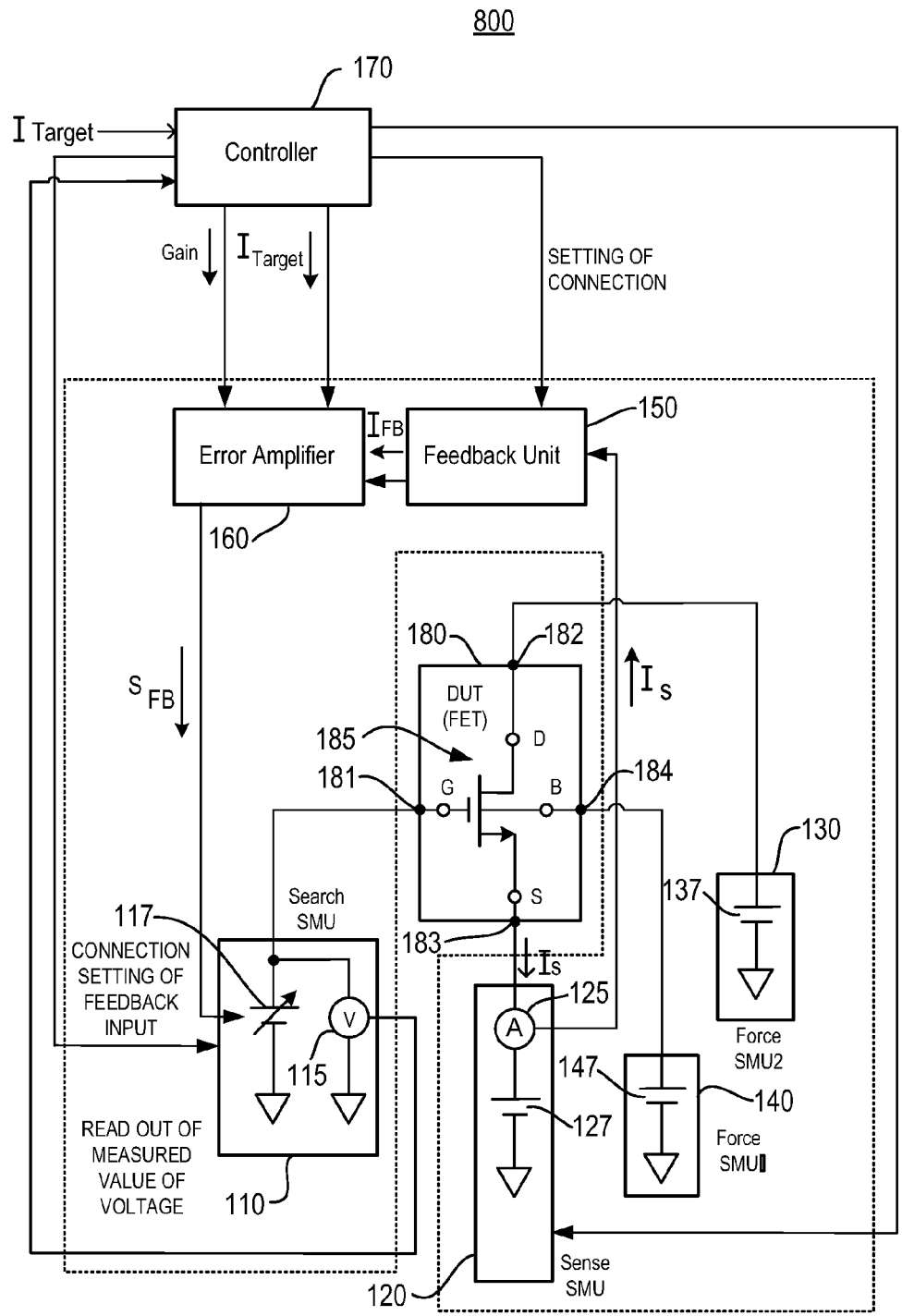
FIG. 8 is a block diagram illustrating a test system for measuring a threshold voltage of a DUT, according to a representative embodiment.

FIG. 8 is a block diagram illustrating a control system for controlling a threshold voltage of a DUT, according to another representative embodiment. Generally, FIG. 8 differs from FIG. 1 in that the second voltage source (e.g., the sense SMU) monitors and outputs the source current $I_S$, as opposed to the drain current $I_D$.

Referring to FIG. 8, test system 800 is configured to control the threshold voltage $V_{TH}$ of the DUT 180, which again in the depicted embodiment includes transistor 185, which may be a MOSFET, for example. Like the test system 100, the test system 800 includes multiple voltage sources for supplying power to the transistor 185, which may be implemented as SMUs. For example, in the depicted embodiment, the test system 800 includes first voltage source unit 110 configured to apply a gate voltage $V_G$ to the gate of the transistor 185 via the DUT gate terminal 181, second voltage source unit 120 configured to apply a source voltage $V_S$ to the source of the transistor 185 via the DUT drain terminal 182, third voltage source unit 130 configured to apply a drain voltage $V_D$ to the source of the transistor 185 via the DUT source terminal 183, and fourth voltage source unit 140 configured to apply a source-body voltage VSB to the body of the transistor 185 via a DUT body terminal 184. The configurations of the first through fourth voltage sources 110 to 140 are substantially the same as discussed above with reference to FIG. 1, and therefore will not be repeated. However, the connections among certain components have changed due to the location of the second voltage source unit 120, as discussed below.

As shown in FIG. 8, the second voltage source unit 120 may be a sense SMU, for example, including current measurement device 125 and voltage source 127 connected in series with the current measurement device 125 between the source terminal 183 of the DUT 180 and ground voltage. The sense SMU thus continuously monitors the source current $I_S$ flowing through the source of the transistor 185. The third voltage source unit 130 may be a first force SMU, including a voltage source 137 connected between the drain terminal 182 and ground voltage. The first voltage source unit 110 may be a search SMU and the fourth voltage source unit 140 may be a second force SMU, as described above with reference to FIG. 1.

The test system 800 further includes feedback unit 150, error amplifier 160, and controller 170. The source current $I_S$ monitored by the second voltage source unit 120 is detected by the feedback unit 150, which outputs feedback current $I_{FB}$ to the error amplifier 160 in response. The output feedback current $I_{FB}$ is based on the source current $I_S$. The error amplifier 160 is configured to receive the feedback current $I_{FB}$ from the feedback unit 150 and to determine feedback control signal $S_{FB}$ based on a comparison between the feedback current $I_{FB}$ and a target current value $I_{target}$. In the depicted embodiment, the target current value $I_{target}$ corresponds to the source current $I_S$ in a sub-threshold region of the transistor 185. As mentioned above, in alternative configurations, the feedback unit 150 may be implemented simply as a wire or other conductor.

As discussed above, the controller 170 receives the target current value $I_{target}$, which may be input by the user, for example, at the beginning of the measurement process. The controller 170 calculates the feedback gain of the error amplifier 160 based on the target current value $I_{target}$ and a coefficient (e.g., the constant of proportionality), and is determined by a relationship between the gate voltage $V_G$ and the source current $I_S$ in the sub-threshold region of the transistor 185. The controller 170 sets both the calculated feedback gain and the target current value $I_{target}$ in the error amplifier 160 as part of the feedback loop.

The first voltage source unit 110 receives the feedback control signal $S_{FB}$ from the error amplifier 160, and adjusts (corrects) the gate voltage $V_G$ in response via operation of the variable voltage source 117. The adjusted gate voltage $V_G$ is applied to the gate terminal of the transistor 185, so that the value of the source current $I_S$ converges toward the target current value $I_{target}$. Ultimately, the convergence to the target current value $I_{target}$ thus occurs in through the feedback loop.

Notably, a method of controlling the threshold voltage $V_{TH}$ of the DUT 180 using the test system 800, according to a representative embodiment, is substantially the same as the method depicted in the flow diagram of FIG. 3. The differences are in block S314, where the value of the drain voltage $V_D$ is set for the third voltage source unit 130 (first force SMU) to be applied to the DUT drain terminal 182, and in block S315, where the value of the source voltage $V_S$ is set for the second voltage source unit 120 (sense SMU) to be applied to the DUT source terminal 183 and the feedback destination of the source current value measured by the current measurement device 125 is set to the feedback unit 150. Similarly, Equations (3) and (6) may be modified to be equally applicable to the configuration of the test system 800 as they are to the test system 100 by substituting each drain current $I_d$ with source current $I_s$.

Referring to FIG. 1, in an alternative embodiment the test system 100 may be configured to feed back the current value, which is obtained by differentiating the feedback current on the sense SMU side, or to feed back the value, which is obtained by subtracting the current of one terminal from the current of another terminal, from the sense SMU. For example, in FIG. 1, another SMU may be provided at the source terminal 183 to measure inflowing current (e.g., leak current $I_{leak}$). A current value obtained by subtracting the leak current $I_{leak}$ from the source current $I_S$ may be fed back from the sense SMU.

In addition, also with reference to FIG. 8, in the same manner as described above, the test system 800 may be configured to feed back the current value, which is obtained by differentiating the feedback current on the sense SMU side, or to feed back the value, which is obtained by subtracting the current of one terminal from the current of another terminal, from the sense SMU. For example, in FIG. 8, another SMU may be provided at the drain terminal 182 to measure inflowing current (e.g., leak current $I_{leak}$). A current value obtained by subtracting the leak current $I_{leak}$ from the drain current $I_D$ may be fed back from the sense SMU.

Separately from the convergence determination methods described above, it is possible to set the minimum value of gm/Id from an expected normal device area of the DUT 180 in advance. By using the minimum value of gm/Id, it is possible to estimate the maximum time elapsed until the convergence to the threshold voltage Vth is achieved. In addition, it is also possible to set the maximum time for the convergence as a timeout period for the measurement. In this case, when the convergence is not achieved even after the lapse of the maximum time, the test device may be configured to return an error status to the user as abnormal convergence.

Also, in FIGS. 1 and 8, the DUT 180 is shown as including an N-type FET as the transistor 185 as an example. However, the various embodiments apply in substantially the same manner when the transistor 185 is a P-type FET.

Figure 9:
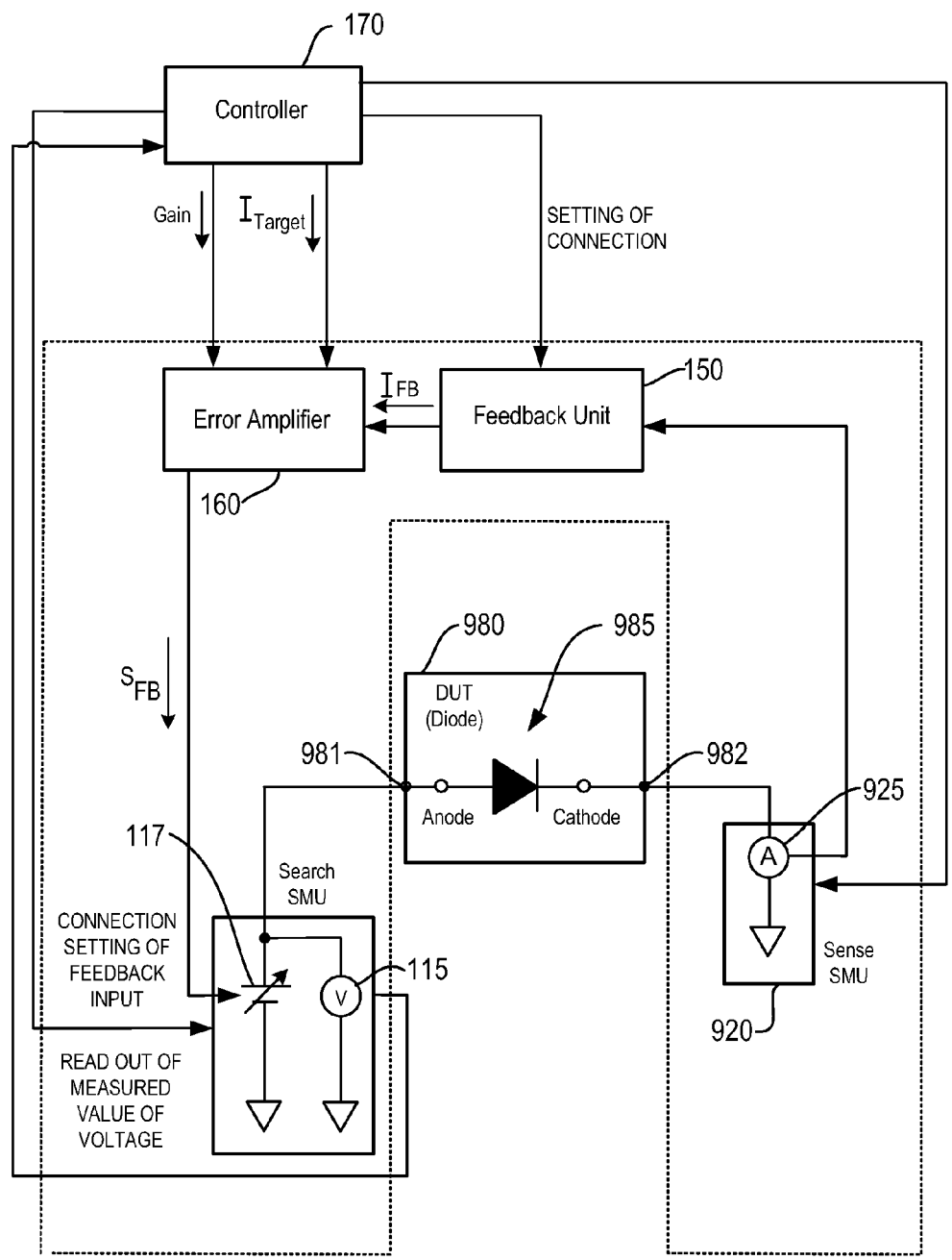
FIG. 9 is a block diagram illustrating a test system for measuring a bias voltage of a DUT, according to a representative embodiment.

FIG. 9 is a block diagram illustrating a test system for measuring a bias voltage of a DUT, according to a representative embodiment. Generally, FIG. 9 differs from FIG. 1 in that the DUT includes a diode as opposed to a transistor.

Referring to FIG. 9, test system 900 is configured to measure the bias voltage $V_{bias}$ of the DUT 980, which in the depicted embodiment includes diode 985 having an anode and a cathode. The test system 900 includes first voltage source unit 110 configured to apply a bias voltage $V_{bias}$ to the anode of the diode 985 via the DUT input terminal 981, and second voltage source unit 120 configured to apply a cathode voltage to the cathode of the diode 985 via DUT output terminal 982. The first voltage source unit 110 may be a search SMU, for example, including voltage measurement device 115 and variable voltage source 117, as described above. The second voltage source unit 120 may be a sense SMU, for example, including a current measurement device 125 connected to the DUT output terminal 982. The sense SMU typically forces 0V, for example. The current measurement device 125 of the sense SMU continuously monitors the diode current Id flowing through the diode 985.

The test system 900 further includes feedback unit 150, error amplifier 160 and controller 170. The diode current Id monitored by the current measurement device 125 is detected by the feedback unit 150, which outputs feedback current $I_{FB}$ to the error amplifier 160 in response. The output feedback current $I_{FB}$ is based on the diode current Id. The error amplifier 160 is configured to receive the feedback current $I_{FB}$ from the feedback unit 150 and to determine feedback control signal $S_{FB}$ based on a comparison between the feedback current $I_{FB}$ and a target current value $I_{target}$. As mentioned above, in alternative configurations, the feedback unit 150 may be implemented simply as a wire or other conductor.

As discussed above, the controller 170 receives the target current value $I_{target}$, which may be input by the user, for example, at the beginning of the measurement process. The controller 170 calculates feedback gain of the error amplifier 160 based on the target current value $I_{target}$ and a coefficient (e.g., the constant of proportionality), and sets the feedback gain in the error amplifier 160. Also, in an embodiment, the controller 170 is configured to monitor total feedback gain of the test system 900, and to adjust the feedback gain of the error amplifier 160 dynamically when the total feedback gain exceeds a predetermined range, as discussed above.

The first voltage source unit 110 receives the feedback control signal $S_{FB}$ from the error amplifier 160, and adjusts (corrects) the bias voltage $V_{bias}$ in response via operation of the variable voltage source 117. The adjusted bias voltage Vbias is applied to the anode of the diode 985, so that the value of the diode current Id converges to the target current value $I_{target}$. The convergence to the target current value $I_{target}$ thus occurs in a single feedback loop.

In an embodiment, the test system 900 may further include a convergence determination device (not shown), which also receives the target current value $I_{target}$, as well as determination criterion, from the controller 170, as discussed above with reference to FIG. 7. For example, the determination criterion may be a range of current values based on the target current value $I_{target}$ (e.g., ±x percentage of the target current value $I_{target}$). The convergence determination device then monitors the output from the feedback unit 150 to determine whether the value of the feedback current $I_{FB}$ meets the determination criterion. When the feedback current $I_{FB}$ meets the determination criterion (e.g., a predetermined current value range, as discussed above), the convergence determination device sends a convergence end trigger signal $S_{trigger}$ to the controller 170, which then determines that the convergence is finished. Thus, use of the convergence determination device enables the waiting time for convergence to occur to be smaller than the predetermined waiting time, discussed above.

With regard to the gain setting for the error amplifier 160 performed by the controller 170 illustrated in FIG. 9, current Id flowing through the diode 985 may be expressed by Equation (8):

$$Id = Is(e^{(qV/kT)} - 1) \qquad (8)$$

In Equation (8), "V" is the bias voltage of the diode 985 and "Is" is the saturation current for the current flowing through the diode 985. Equation (8) is a well know relationship in the art, as indicated for example by Agilent Technologies, PARAMETRIC MEASUREMENT HANDBOOK, Third Edition, Chapter 7 (March 2012), which is hereby incorporated by reference.

Accordingly, transmission gain gm may be expressed by being differentiated, as shown in Equation (9), where "Id" is the diode current:

$$gm = dId/dV = (q/kT)Is \times e^{qV/kT}$$

$$gm \cong (q/kT)Id(Id \gg Is) \qquad (9)$$

Accordingly, it is possible to limit the range of the transmission gain gm by limiting ambient temperature range within a range that satisfies the diode current Id being much larger than the saturation current Is (Id>>Is). In other words, the differential transmission gain gm of the drain current with reference to the bias voltage of the diode 985 exponentially varies with respect to variation of the bias voltage. Therefore, up to now, a possible gain low enough to avoid oscillation is set.

However, in actuality, from the above-mentioned Equation (9), the transmission gain gm and the diode current Id are in a substantially linear relationship (in the area of Id>>Is). When the user sets the target current value $I_{target}$ based on Equation (9), it is possible to limit the maximum value of the transmission gain gm within a given range. Accordingly, it is possible to set the feedback gain of the error amplifier 160 without oscillation using only the target current value $I_{target}$, e.g., set by the user. As a result, it is possible to cause the diode 985 to converge to such a value of the bias voltage as to exhibit the target current value $I_{target}$ with the convergence speed within a range expected in advance without oscillation.

Figure 10:
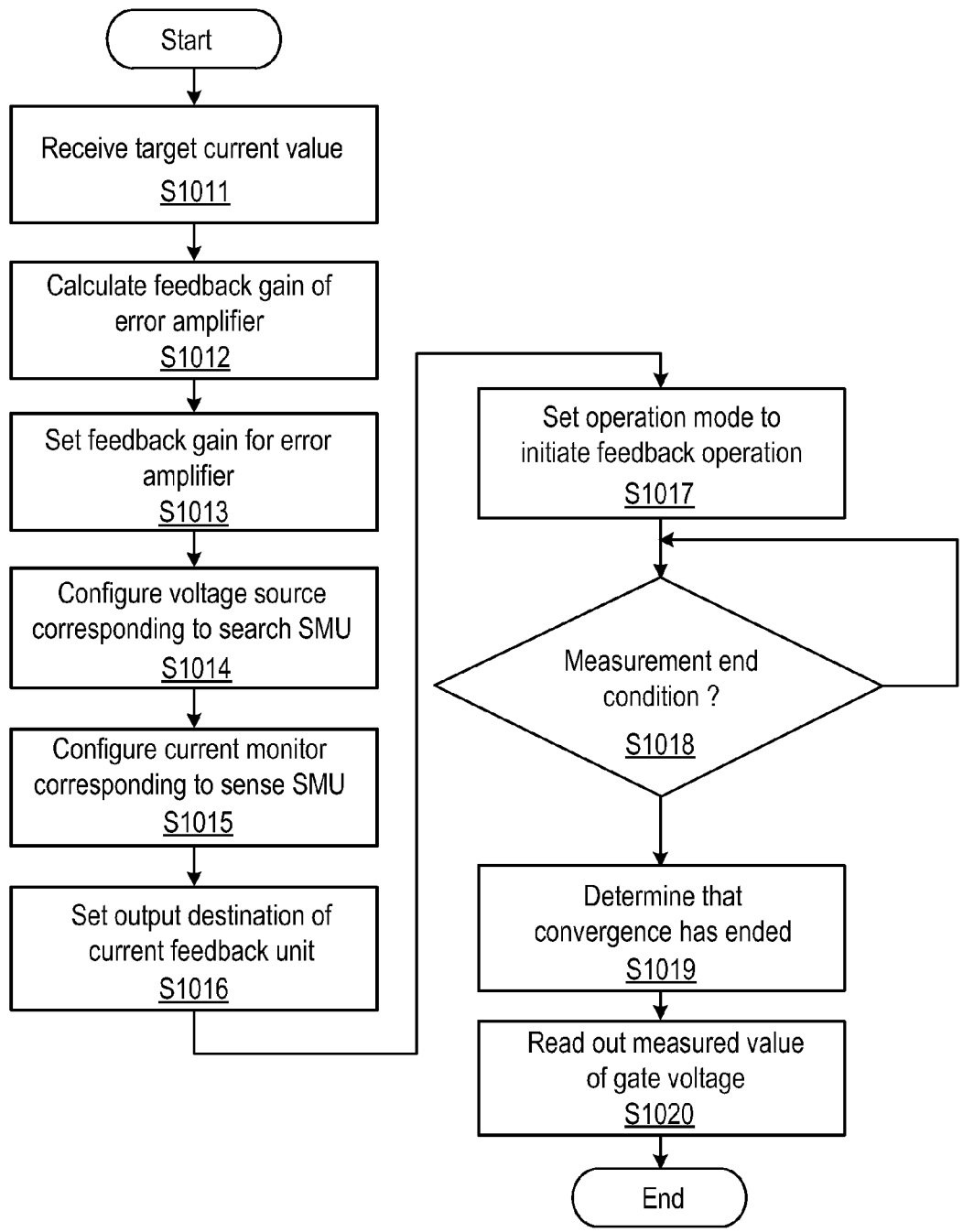
FIG. 10 is a flow diagram illustrating a method of measuring a bias voltage of a DUT, according to a representative embodiment.

FIG. 10 is a flow diagram illustrating a method of measuring a bias voltage of a DUT, according to a representative embodiment. The various operations depicted in FIG. 10 may be executed by the controller 170 shown in FIG. 9, for example.

Referring to FIGS. 9 and 10, the controller 170 receives setting information, such as the target current value $I_{target}$, in block S1011. The target current value $I_{target}$ may be provided by a user or another control device, for example, through an appropriate I/O interface, as would be apparent to one of ordinary skill in the art. The feedback gain of the error amplifier 160 is calculated based on the target current value $I_{target}$ in block S1012, and the calculated feedback gain is set in the error amplifier 160 in block S1013.

The controller 170 configures the first voltage source unit 110 (search SMU) for the measurement operation in block S1014. This configuration includes setting the start value of the bias voltage $V_{bias}$ for the first voltage source unit 110 to be applied to the diode 985, setting the first voltage source unit 110 to a voltage measurement mode (of bias voltage $V_{bias}$), and setting an operation mode of the first voltage source unit 110 to an operation based on feedback (feedback current $I_{FB}$) provided by the feedback unit 150, as mentioned below. Notably, when the DUT 980 is subjected to repeated measurements of a bias voltage $V_{bias}$ in a similar manner, e.g., as in the case of an array test structure, the step of setting the start value of the applied bias voltage $V_{bias}$ for the first voltage source unit 110 may be omitted, and the present voltage value may be used as a start voltage in order to shorten measurement time.

In block S1015, the controller 170 configures the second voltage source unit 120 (sense SMU) for the measurement operation. This configuration includes setting the value of the voltage for the second voltage source unit 120, setting the second voltage source unit 120 to a current measurement mode (of diode current Id), and setting a feedback destination of the diode current value measured by the current measurement device 125 to the feedback unit 150. Likewise, the controller 170 sets an output destination of the current value of the feedback unit 150 so as to be connected to the first voltage source unit 110 via the error amplifier 160 in step S1016.

The feedback operation from the first voltage source unit 110 (sense SMU) to the second voltage source unit 120 (search SMU) is initiated in block S1017 based on the setting of the operation mode of the first voltage source unit in block S314 to perform measurement of the bias voltage $V_{bias}$. In block S1018, the controller 170 determines whether the measurement end condition has been satisfied by performance of the feedback operation. The determination regarding satisfying the measurement end decision may be substantially the same as discussed above with regard to block S319 in FIG. 3. When the measurement end condition has not been satisfied (block S1018: No), performance of the feedback operation continues, resulting in a lapse of time (waiting time) for the measurement. When the measurement end condition is satisfied (block S1018: Yes), the controller 170 determines that the convergence has ended in block S1019, and reads out the measured value of the bias voltage Vbias from the voltage measurement device 115 of the first voltage source unit 110 in block S320. The measured value indicates the bias voltage $V_{bias}$ corresponding to the target current value $I_{target}$ of the diode current Id.

Following the read out of the measured bias voltage $V_{bias}$, the controller 170 resets the test system 900 to prepare for determination of the bias voltage $V_{bias}$ for the next DUT. That is, the controller 170 sets the connection setting of the first voltage source unit 110 back to an original operation mode, e.g., a normal operation mode inside the stand-alone first voltage source unit 110. The controller 170 also disconnects the connection setting for the feedback unit 150, and disconnects the connection setting of current value feedback for the second voltage source unit 120. Each of the first voltage source unit 110, the second voltage source unit 120 and the feedback unit 150 are thereby returned to their respective initial states.

The various embodiments described herein may be applied, for example, to high-speed and high-precision measurements performed by a constant current method for MOS and other types of devices. That is, the various embodiments enable measurement of various parameters in such a state as to satisfy a desired current value (e.g., target current value $I_{target}$).

As is apparent by comparing FIGS. 5 and 6, conventional methods, such as binary and linear search methods, require longer measurement times than the various embodiments described herein because the setting of the gate voltage, waiting for convergence, and performing the measurement are repeated in the conventional methods. Also, according to the binary search method as discussed above, a signal having a value equal to or larger than a target value may be applied, but according to the various embodiments, a signal having a value equal to or larger than the target value is not applied, thus reduces stress on the DUT.

Table 1 below indicates the significant differences in measurement time between the embodiment depicted in FIG. 1, for example, and the conventional binary and linear search methods. In particular, Table 1 depicts average measurement time for measurements performed on 60 devices on a wafer by the corresponding methods.

TABLE 1

| Measurement method | Average measurement time |
| --- | --- |
| Linear search | >100 ms |
| Binary search | 40 ms |
| Representative embodiment in FIG. 1 | 6 ms |

In addition, when continuous measurement was carried out for a single device 200 times, it was confirmed that differences of the average value among the measurement results are sufficiently small, e.g., 1 mV or less. Also, as an additional advantage, according to the various embodiments, it is not necessary to input a parameter dependent on the DUT.

While the disclosure references exemplary embodiments, it will be apparent to those skilled in the art that various changes and modifications may be made without departing from the spirit and scope of the present teachings. Therefore, it should be understood that the above embodiments are not limiting, but illustrative.

The invention claimed is:

1. A test system for measuring at least one parameter of a device under test (DUT) comprising a transistor, the system comprising:
a first voltage source unit configured to supply a gate voltage to a gate of the transistor, the first voltage source unit comprising a voltage measurement device;
a second voltage source unit configured to supply one of a drain voltage or a source voltage to a drain or a source of the transistor, respectively, the second voltage source unit comprising a current measurement device configured to detect one of a drain current or a source current flowing through the drain or the source of the transistor, respectively;
a feedback unit configured to connect with the current measurement device and to output a feedback current during a feedback control operation, based on the one of the drain current or the source current detected by the current measurement device; and
an error amplifier configured to output a feedback control signal, based on comparison of the feedback current and a target current value, to the first voltage source unit,
wherein the first voltage source unit is further configured to adjust the gate voltage of the transistor in response to the feedback control signal so that the one of the drain current or the source current converges to match the target current value, and
wherein the error amplifier includes a feedback gain determined based on the target current value and a coefficient, which is determined by a relationship between the gate voltage and the one of the drain current or the source current in a sub-threshold region of the transistor.

2. The system of claim 1, further comprising:
a controller configured to calculate the feedback gain, and to set the calculated feedback gain in the error amplifier.

3. The system of claim 2, wherein the controller is further configured to monitor total feedback gain of the system, and to adjust the feedback gain of the error amplifier dynamically when the total feedback gain exceeds a predetermined range.

4. The system of claim 2, wherein the first voltage source unit comprises a search source measurement unit (SMU).

5. The system of claim 4, wherein the second voltage source unit comprises a sense SMU.

6. The system of claim 2, wherein the voltage measurement device of the first voltage source unit measures the gate voltage after the one of the drain current or the source current has converged to the target current value, and outputs the measured gate voltage to the controller.

7. The system of claim 6, wherein the measured gate voltage comprises a threshold voltage of the transistor.

8. The system of claim 2, wherein the controller is further configured to determine whether the one of the drain current or the source current has converged with the target current value based on whether a predetermined waiting time has elapsed after a start of the feedback control operation.

9. The system of claim 2, further comprising:
a convergence determination device configured to detect when the one of the drain current or the source current has entered a predetermined range based on the feedback current, and to send a trigger signal indicating the convergence to the controller.

10. A test system for measuring at least one parameter of a device under test (DUT) comprising a diode, the system comprising:
a first voltage source unit connected to an anode of the diode and configured to supply a bias voltage to the anode, the first source unit comprising a voltage measurement device;
a second voltage source unit connected to a cathode of the diode and comprising a current measurement device configured to detect a diode current flowing through the diode;
a feedback unit configured to connect with the current measurement device and to output a feedback current during a feedback control operation based on the diode drain current; and
an error amplifier configured to output a feedback control signal, based on comparison of the feedback current and a target current value, to the first voltage source unit,
wherein the first voltage source unit is further configured to adjust the bias voltage of the transistor in response to the feedback control signal so that the diode current converges to match the target current value, and
wherein the error amplifier includes a feedback gain based on the target current value and a coefficient, which is determined by a relationship between the bias voltage and the diode current.

11. The system of claim 10, further comprising:
a controller configured to calculate the feedback gain, and to set the calculated feedback gain in the error amplifier.

12. The system of claim 11, wherein the controller is further configured to monitor total feedback gain of the system, and to adjust the feedback gain of the error amplifier dynamically when the total feedback gain exceeds a predetermined range.

13. The system of claim 11, wherein the first voltage source unit comprises a search source measurement unit (SMU).

14. The system of claim 13, wherein the second voltage source unit comprises a sense SMU.

15. The system of claim 11, wherein the voltage measurement device of the first voltage source unit measures the bias voltage after the diode current has converged to the target current value, and outputs the measured bias voltage to the controller.

16. The system of claim 11, wherein the controller is further configured to determine whether the diode current has converged with the target current value based on whether a predetermined waiting time has elapsed after a start of the feedback control operation.

17. The system of claim 11, further comprising:
a convergence determination device configured to detect when the diode current has entered a predetermined range based on the feedback current, and to send a trigger signal indicating the convergence to the controller.

18. A test system for measuring at least one parameter of a device under test (DUT) comprising a transistor, the system comprising:
a first voltage source unit configured to supply a gate voltage to a gate of the transistor, the first voltage source unit comprising a voltage measurement device;
a second voltage source unit configured to supply one of a drain voltage or a source voltage to a drain or a source of the transistor, respectively, the second voltage source unit comprising a current measurement device configured to detect one of a drain current or a source current flowing through the drain or the source of the transistor, respectively;
a feedback unit configured to connect with the current measurement device and to output a feedback current during a feedback control operation, based on the one of the drain current or the source current detected by the current measurement device;
an error amplifier configured to output a feedback control signal to the first voltage source unit, the feedback control signal being based on a feedback gain of the error amplifier and on a comparison of the feedback current from the feedback unit and a target current value;
a convergence determination device configured to monitor total feedback gain of the system based on measurements at different time points of the gate voltage and the one of the drain current or the source current, and to provide a corresponding transmission gain; and
a controller configured to adjust the total feedback gain of the system in response to the transmission gain.

19. The system of claim 18, wherein the controller adjusts the total feedback gain of the system by dynamically adjusting the feedback gain of the error amplifier when the total feedback gain of the system exceeds a predetermined range.

20. The system of claim 19, wherein the gate voltage is modified in response to the feedback control signal from the error amplifier so that the one of the drain current or the source current converges to match the target current value.

* * * * *